United States Patent
Muthiah et al.

(10) Patent No.: US 11,797,409 B1
(45) Date of Patent: Oct. 24, 2023

(54) METHOD AND SYSTEM FOR MANAGING TRANSACTIONS BURSTINESS AND GENERATING SIGNATURE THEREOF IN A TEST ENVIRONMENT

(71) Applicant: HCL America Inc., Sunnyvale, CA (US)

(72) Inventors: Manickam Muthiah, Shrewsbury, MA (US); Razi Abdul Rahim, Willowbrook, IL (US)

(73) Assignee: HCL AMERICA INC.

( * ) Notice: Subject to any disclaimer, the term of this patent is extended or adjusted under 35 U.S.C. 154(b) by 0 days.

(21) Appl. No.: 17/901,858

(22) Filed: Sep. 2, 2022

(51) Int. Cl.
  *G06F 11/273* (2006.01)
  *G01R 31/317* (2006.01)
  *G01R 31/3181* (2006.01)

(52) U.S. Cl.
  CPC .... *G06F 11/2733* (2013.01); *G01R 31/31704* (2013.01); *G01R 31/31727* (2013.01); *G01R 31/31813* (2013.01); *G06F 2201/83* (2013.01)

(58) Field of Classification Search
  CPC ............. G06F 11/2733; G06F 2201/83; G01R 31/31704; G01R 31/31727; G01R 31/31813
  See application file for complete search history.

(56) References Cited

U.S. PATENT DOCUMENTS

| | | |
|---|---|---|
| 9,087,036 B1 | 7/2015 | Chou et al. |
| 10,243,758 B2 | 3/2019 | Vári et al. |
| 2016/0037363 A1* | 2/2016 | Kairouz ............... H04W 24/00 370/252 |
| 2019/0025415 A1 | 1/2019 | Suchy et al. |
| 2020/0089634 A1 | 3/2020 | Jalal et al. |
| 2021/0067455 A1* | 3/2021 | Lahtiranta ............. H04L 9/3236 |

FOREIGN PATENT DOCUMENTS

WO  2016018927 A1  7/2015

OTHER PUBLICATIONS

F. Liu, Y. Fan, X. Shen, C. Lin and R. Zeng, "An Analytical Model to Study the Packet Loss Burstiness over Wireless Channels," 2010 IEEE Global Telecommunications Conference GLOBECOM 2010, Miami, FL, USA, 2010, pp. 1-5. (Year: 2010).*

Giuliano Casale, Ningfang Mi, Ludmila Cherkasova, and Evgenia Smirni; Dealing with Burstiness in Multi-Tier Applications: Models and Their Parameterization; 1-15.

* cited by examiner

*Primary Examiner* — Cynthia Britt

(57) ABSTRACT

A method for managing transactions burstiness associated with a sequence of transactions generated in a test environment for verifying a Device Under Test (DUT) is disclosed. In some embodiments, the method includes processing a plurality of signals associated with a sequence of transactions. The method further includes generating a transactions burstiness signature representative of the sequence of transactions based on processing a set of signals from the plurality of signals. The method further includes analysing the transactions burstiness signature to identify at least one pattern of interest. The method further includes iteratively providing an input comprising at least one missing pattern of interest. The method further includes iteratively generating a subsequent sequence of transactions and a subsequent transactions burstiness signature associated with the subsequent sequence of transactions.

17 Claims, 9 Drawing Sheets

US 11,797,409 B1

METHOD AND SYSTEM FOR MANAGING TRANSACTIONS BURSTINESS AND GENERATING SIGNATURE THEREOF IN A TEST ENVIRONMENT

TECHNICAL FIELD

Generally, the invention relates to a test environment for verifying Device Under Test (DUT). More specifically, the invention relates to method and system for managing transactions burstiness associated with a sequence of transactions generated in a test environment for verifying a Device Under Test (DUT).

BACKGROUND

Each device or system present in a test environment needs to be verified for functional correctness or soundness after manufacturing. The verification of the device is done to make device fit for usage. In order to perform verification of a device, various type of input data is provided to the device. Currently, there is no standard mechanism available to easily identify whether the input transactions driven to a Device Under Test (DUT) present in the test environment have a specific burst transactions pattern. In addition, none of the existing mechanisms provide an encoded representation of the burstiness of the input transactions driven to the DUT for a test.

In addition, none of the existing mechanisms enable an easy comparison of the burstiness of the input transactions in one test against the burstiness of the input transactions from another test. Further, these existing mechanisms do not provide any information on how to easily control the test environment to generate the burst transactions pattern that is of interest without spending a lot of effort or hand-coding a test sequence for the burst transactions pattern generation. Moreover, by using these existing mechanisms, generating lengthy burst transactions pattern of interest that includes a specific sequence of burst transactions requires a lot of manual effort. Further, none of the existing mechanism enables an easy generation of multiple burst transactions patterns of interest that need to be provided as an input to the DUT.

Therefore, there is a need of implementing an efficient and reliable technique for managing transactions burstiness associated with a sequence of transactions generated in a test environment for verifying a Device Under Test (DUT).

SUMMARY OF INVENTION

In one embodiment, a method of managing transactions burstiness associated with a sequence of transactions generated in a test environment for verifying a Device Under Test (DUT) is disclosed. The method may include processing a plurality of signals associated with a sequence of transactions. It should be noted that, the plurality of signals may include at least one of a clock signal, a data valid signal, a data signal, and a burst size signal. The method may include generating a transactions burstiness signature representative of the sequence of transactions based on processing a set of signals from the plurality of signals. It should be noted that, the transactions burstiness signature may include an encoded view of valid and invalid data transmitted in the sequence of transactions and a clock period associated with the clock signal and start time of the sequence of transactions. The method may include analyzing the transactions burstiness signature to identify at least one pattern of interest. The method may include iteratively providing an input comprising at least one missing pattern of interest based on a determination of at least one missing pattern of interest in the transactions burstiness signature. It should be noted that, in an embodiment, no pattern of interest may be absent or missing in the transactions burstiness signature. Based on the determination that at least one pattern of interest is missing, the method may include iteratively generating a subsequent sequence of transactions and a subsequent transactions burstiness signature associated with the subsequent sequence of transactions. It should be noted that, the subsequent sequence of transactions and the subsequent transactions burstiness signature may be iteratively generated till the subsequent transactions burstiness signature may comprise each of the pattern of interest.

In another embodiment, a system for managing transactions burstiness associated with a sequence of transactions generated in a test environment for verifying a Device Under Test (DUT) is disclosed. The system includes a processor and a memory communicatively coupled to the processor. The memory may store processor-executable instructions, which, on execution, may cause the processor to process a plurality of signals associated with a sequence of transactions. It should be noted that, the plurality of signals may comprise at least one of a clock signal, a data valid signal, a data signal, and a burst size signal. The processor-executable instructions, on execution, may further cause the processor to generate a transactions burstiness signature representative of the sequence of transactions based on processing a set of signals from the plurality of signals. It should be noted that, the transactions burstiness signature may comprise an encoded view of valid and invalid data transmitted in the sequence of transactions and a clock period associated with the clock signal and start time of the sequence of transactions. The processor-executable instructions, on execution, may further cause the processor to analyze the transactions burstiness signature to identify at least one pattern of interest. The processor-executable instructions, on execution, may further cause the processor to iteratively provide an input comprising at least one missing pattern of interest. It should be noted that, the at least one missing pattern of interest may be absent in the transactions burstiness signature. The processor-executable instructions, on execution, may further cause the processor to iteratively generate a subsequent sequence of transactions and a subsequent transactions burstiness signature associated with the subsequent sequence of transactions. It should be noted that, the subsequent sequence of transactions and the subsequent transactions burstiness signature may be iteratively generated till the subsequent transactions burstiness signature may comprise each of the at least one missing pattern of interest.

In yet another embodiment, a non-transitory computer-readable medium storing computer-executable instruction for managing transactions burstiness associated with a sequence of transactions generated in a test environment for verifying a Device Under Test (DUT) is disclosed. The stored instructions, when executed by a processor, may cause the processor to perform operations including processing a plurality of signals associated with a sequence of transactions. It should be noted that, the plurality of signals may comprise at least one of a clock signal, a data valid signal, a data signal, and a burst size signal. The operations may further include generating a transactions burstiness signature representative of the sequence of transactions based on processing a set of signals from the plurality of signals. The transactions burstiness signature may comprise an encoded view of valid and invalid data transmitted in the sequence of transactions and a clock period associated with the clock signal and start time of the sequence of transactions. The operations may further include analysing the transactions burstiness signature to identify at least one pattern of interest. The operations may further include iteratively providing an input comprising at least one missing pattern of interest. The at least one missing pattern of interest may be absent in the transactions burstiness signature. The operations may further include iteratively generating a subsequent sequence of transactions and a subsequent transactions burstiness signature associated with the subsequent sequence of transactions. It should be noted that, the subsequent sequence of transactions and the subsequent transactions burstiness signature may be iteratively generated till the subsequent transactions burstiness signature may comprise each of the at least one missing pattern of interest.

It is to be understood that both the foregoing general description and the following detailed description are exemplary and explanatory only and are not restrictive of the invention, as claimed.

BRIEF DESCRIPTION OF THE DRAWINGS

The present application can be best understood by reference to the following description taken in conjunction with the accompanying drawing figures, in which like parts may be referred to by like numerals.

DETAILED DESCRIPTION OF THE DRAWINGS

The following description is presented to enable a person of ordinary skill in the art to make and use the invention and is provided in the context of particular applications and their requirements. Various modifications to the embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and devices are shown in block diagram form in order not to obscure the description of the invention with unnecessary detail. Thus, the invention is not intended to be limited to the embodiments shown, but is to be accorded the widest scope consistent with the principles and features disclosed herein.

While the invention is described in terms of particular examples and illustrative figures, those of ordinary skill in the art will recognize that the invention is not limited to the examples or figures described. Those skilled in the art will recognize that the operations of the various embodiments may be implemented using hardware, software, firmware, or combinations thereof, as appropriate. For example, some processes can be carried out using processors or other digital circuitry under the control of software, firmware, or hardwired logic. (The term "logic" herein refers to fixed hardware, programmable logic and/or an appropriate combination thereof, as would be recognized by one skilled in the art to carry out the recited functions.) Software and firmware can be stored on computer-readable storage media. Some other processes can be implemented using analog circuitry, as is well known to one of ordinary skill in the art. Additionally, memory or other storage, as well as communication components, may be employed in embodiments of the invention.

Figure 1:
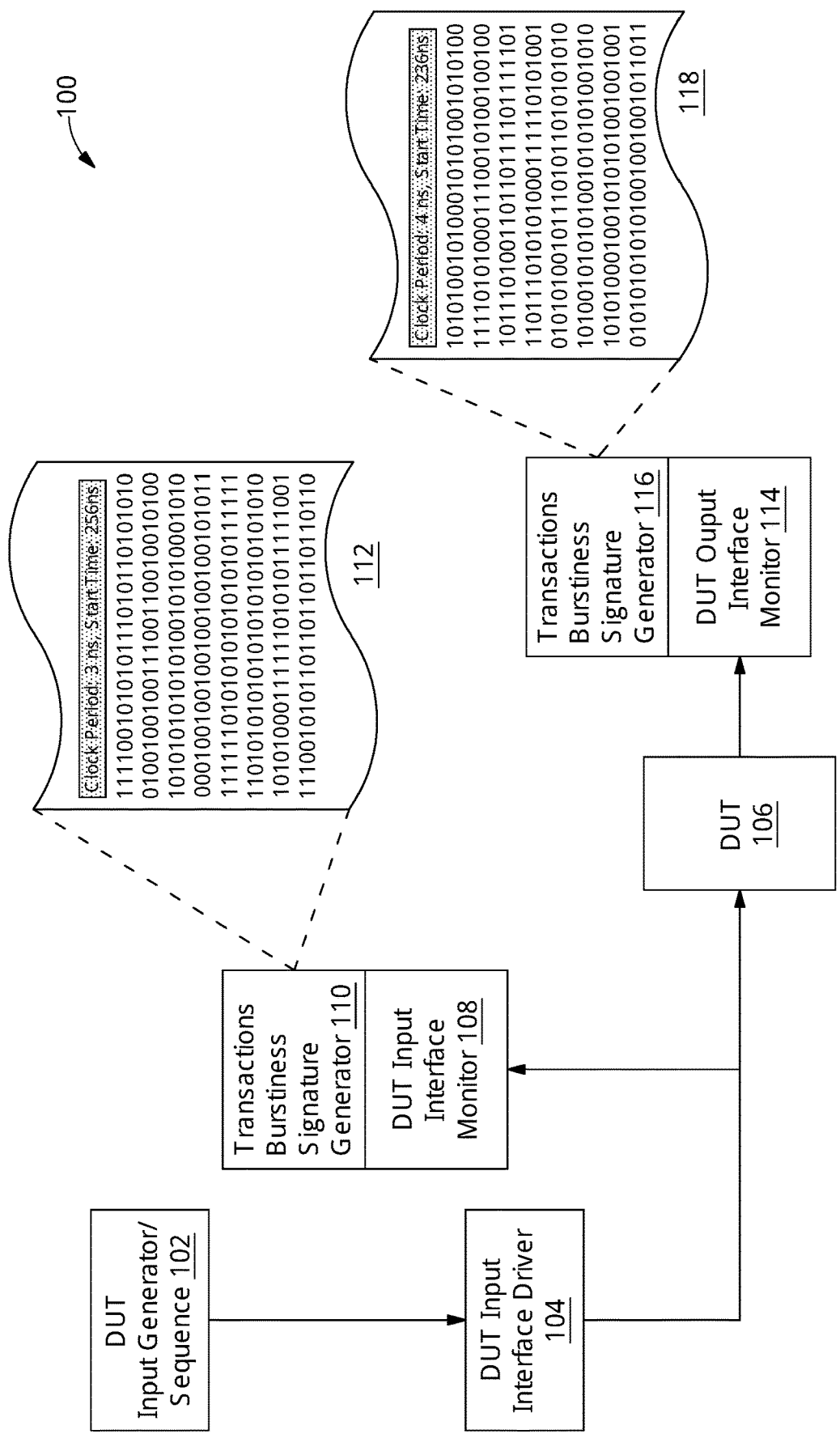
FIG. 1 illustrates a functional block diagram of a system configured to generate a transactions burstiness signature associated with a sequence of transactions generated in a test environment for verifying a Device Under Test (DUT), in accordance with an embodiment.

FIG. 1, illustrates a functional block diagram of a system 100 configured for generating a transactions burstiness signature associated with a sequence of transactions generated in a test environment for verifying a Device Under Test (DUT), in accordance with an embodiment. In order to generate the transactions burstiness signature, initially, a DUT input generator 102 may generate a sequence of transactions. The generated sequence of transactions may be provided as an input to a DUT 106 via a DUT input interface driver 104. Further, in addition to providing the sequence of transactions as the input to the DUT 106, the sequence of transactions may be provided as an input to a transactions burstiness signature generator 110 connected to a DUT input interface monitor 108. Upon receiving the sequence of transactions, the transactions burstiness signature generator 110 may process a set of signals from a plurality of signals associated with the sequence of transactions. The transactions burstiness signature generator 110 may process the set of signals to generate the transactions burstiness signature representative of the sequence of transactions.

In an embodiment, the plurality of signals may include at least one of a clock signal, a data valid signal, a data signal, and a burst size signal. In an embodiment, the data signal may include valid and invalid data (i.e., data packets intermixed with one or more idle cycles or gaps) used for transferring input stimulus to the DUT. Further, the data valid signal may represent valid data (i.e., correct data) received during a cycle of the clock signal (for example, on a positive edge of the clock signal, if the data valid signal is 1, then the data signal has valid data). Further, the burst size signal may represent a number of valid data transmitted in each burst. This has been further explained in detail in reference to FIG. 3, FIG. 4 and FIG. 6 to FIG. 10. A portion of the transactions burstiness signature generated by the transactions burstiness signature generator 110 is depicted via a log file 112. As depicted via the log file 112, the transactions burstiness signature may include an encoded view of valid and invalid data transmitted in the sequence of transactions and a clock period associated with the clock signal and start time of the sequence of transactions. It should be noted that, the transactions burstiness signature generated by the transactions burstiness signature generator 110 may represent the sequence of transactions provided as an input to the DUT 106. This is explained in greater detail in conjunction with FIG. 6 to FIG. 9.

Once the transactions burstiness signature is generated, the generated transactions burstiness signature may be used to identify at least one pattern of interest present in the sequence of transactions. In an embodiment, one or more pattern of interests may be pre-defined and/or pre-stored. In an embodiment, the generated transactions burstiness signature may be analyzed to identify if all or at least one pattern of interest is present in the sequence of transactions.

In an embodiment, it may be determined that in the generated transactions burstiness signature, at least one pattern of interest is missing or absent. Consequently, the at least one missing pattern of interest may be used to iteratively generate a subsequent sequence of transactions and a subsequent transactions burstiness signature may be generated until all the pre-defined pattern of interest are included. This is further explained in detail in reference to FIG. 2-11.

Further, the DUT 106 may process the input sequence of transactions to generate an output sequence of transactions. The output generated by the DUT 106 may be received by a DUT output interface monitor 114. The DUT output interface monitor 114 may be configured to observe and evaluate the generated output. Further, the DUT output interface monitor may be connected with a transactions burstiness signature generator 116. The transactions burstiness signature generator 116 may be configured to process the output received from the DUT 106 by the DUT output interface monitor 114 and generate a transactions burstiness signature for the output. The transactions burstiness signature for the output is represented via a log file 118. In an embodiment, the transactions burstiness signature for the output may also be analyzed to determine if a pre-defined one or more pattern of interests for an output are present. Based on such an analysis, a result representing a success or failure of the test may be provided. In an embodiment, in case the transactions burstiness signature for the output includes all the pre-defined one or more pattern of interests for the output, then the output is rendered to be a success. In case, the transactions burstiness signature for the output includes some of the pre-defined one or more pattern of interests for the output then the output is rendered to be a partial success. In case, the transactions burstiness signature for the output includes none of the pre-defined one or more pattern of interests for the output then the output is rendered to be a failure.

Figure 2:
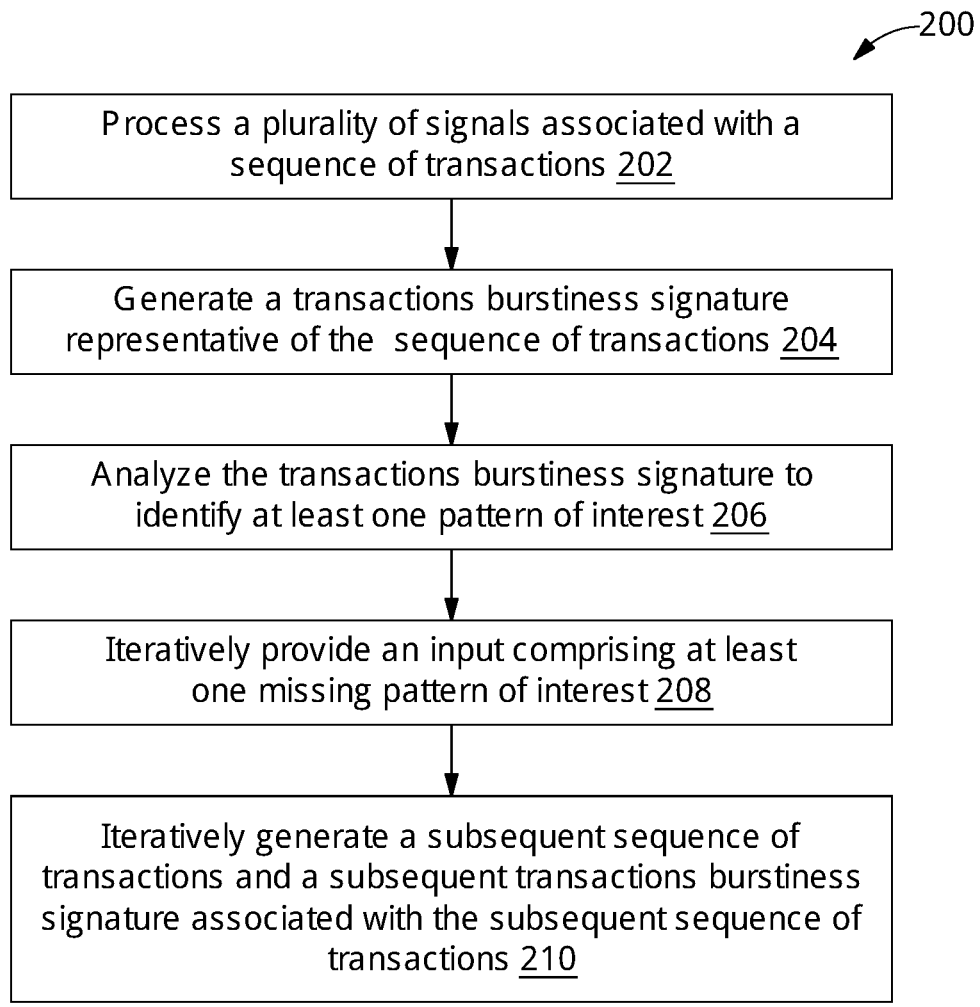
FIG. 2 illustrates a flowchart of a method for managing transactions burstiness associated with a sequence of transactions generated in a test environment for verifying a DUT, in accordance with an embodiment.

Referring now to FIG. 2, a flowchart 200 of a method for managing transactions burstiness associated with a sequence of transactions generated in a test environment for verifying a DUT is illustrated, in accordance with an embodiment. In order to manage the transactions burstiness associated with the sequence of transactions, at step 202, a plurality of signals associated with a sequence of transactions may be processed. In an embodiment, the plurality of signals may include at least one of a clock signal, a data valid signal, a data signal, and a burst size signal. Further, based on processing a set of signals from the plurality of signals, at step 204, a transactions burstiness signature may be generated. The generated transactions burstiness signature may represent the burstiness in the sequence of transactions generated in the test environment.

The transactions burstiness signature may include an encoded view of valid and invalid data transmitted in the sequence of transactions. In an embodiment, the encoded view of each valid data may include information of the associated burst size derived from the burst size signal. Further, each of the associated burst size may represent the number of valid data transmitted in each of a burst. In addition to the encoded view, the transactions burstiness signature may include a clock period associated with the clock signal and start time of the sequence of transactions. This has been represented and explained in detail in conjunction with FIG. 6 to FIG. 9.

Once the transactions burstiness signature associated with the sequence of transactions is generated, at step 206, the generated transactions burstiness signature may be analyzed to identify at least one pattern of interest in the sequence of transactions. The at least one pattern of interest may be pre-defined for a test or the testing environment. The method of identifying the at least one pattern of interest is explained in detail in conjunction with FIG. 5. Upon determination that at least one pattern of interest is missing or absent in the transactions burstiness signature, at step 208, an input that may include at least one missing pattern of interest may be iteratively provided. The at least one missing pattern of interest in the sequence of transactions may be provided as the input (i.e., the feedback input) to the DUT input generator 102. Thereafter, at step 210, a subsequent sequence of transactions may be iteratively generated based on the feedback input associated with each of the at least one missing pattern of interest such that the subsequent sequence of transactions may include the at least one missing pattern of interest. In addition to the subsequent sequence of transactions, a subsequent transactions burstiness signature associated with the subsequent sequence of transactions may be generated in each iteration. In an embodiment, the subsequent sequence of transactions and the subsequent transactions burstiness signature may be iteratively generated till the subsequent transactions burstiness signature includes each of the at least one missing pattern of interest. In other words, the subsequent transactions burstiness signature associated with the subsequent sequence of transactions may be iteratively generated until it is ensured that each of the at least one missing pattern of interest or all of the pre-defined pattern of interest are part of the subsequent transactions burstiness signature. This complete method as discussed in present FIG. 2 has been explained in detail in reference to FIG. 3 to FIG. 11.

Figure 3:
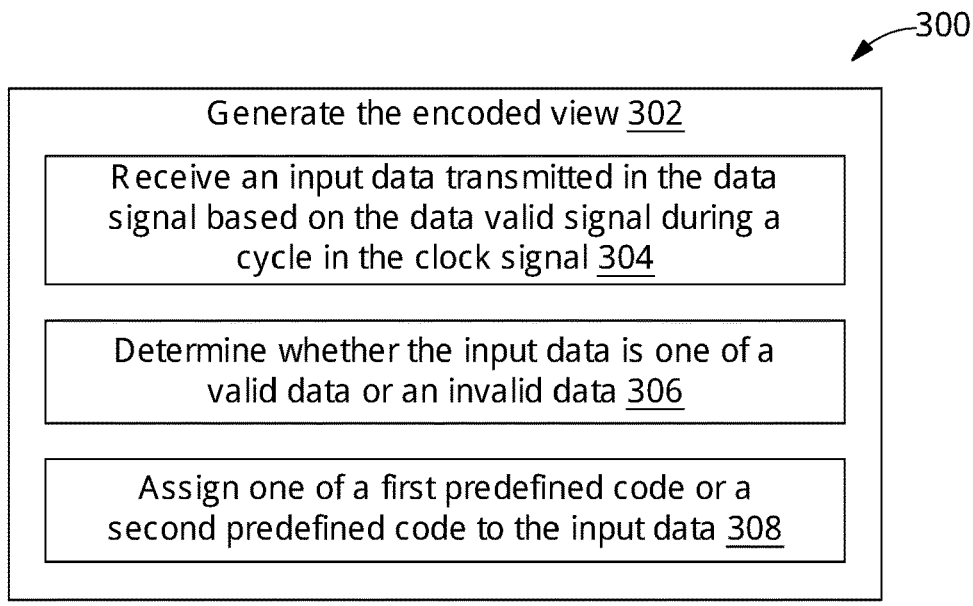
FIG. 3 illustrates a flowchart of a method for generating an encoded view of valid and invalid data transmitted in a sequence of transactions without burst size information, in accordance with an embodiment.

Referring now to FIG. 3, a flowchart of a method 300 for generating an encoded view of valid and invalid data transmitted in a sequence of transactions without burst size information is illustrated, in accordance with an embodiment. In order to generate the encoded view based on the input data as mentioned via step 302, initially, at step 304, an input data may be iteratively received during a clock cycle (for example, at a positive edge of the clock signal). In an embodiment, the input data may correspond to data transmitted in the data signal based on the data valid signal. Upon receiving the input data, at step 306, a check may be performed to determine whether the input data is one of a valid data or an invalid data, in response to receiving the input data. Method of determining valid data and invalid data has been defined and explained in detail in conjugation with FIG. 6. Based on the check performed, at step 308, a first predefined code or a second predefined code may be assigned to the input data received during the clock cycle.

In an embodiment, the first predefined code may be assigned to each valid data, whereas the second predefined code may be assigned to each invalid data. In other words, based on the check performed upon receiving first input data during a clock cycle, the check may be performed to determine whether the first input data received is the valid data or the invalid. If the first input data received is the valid data, then the first pre-defined code (for example, '1', 'a', or 'A') may be assigned to the first input data. Whereas, if the first input data received is the invalid data, then the second pre-defined code (for example, '0', 'b', or 'B') may be assigned to the first input data. This has been further explained in detail in reference to FIG. 6 and FIG. 7.

Figure 4:
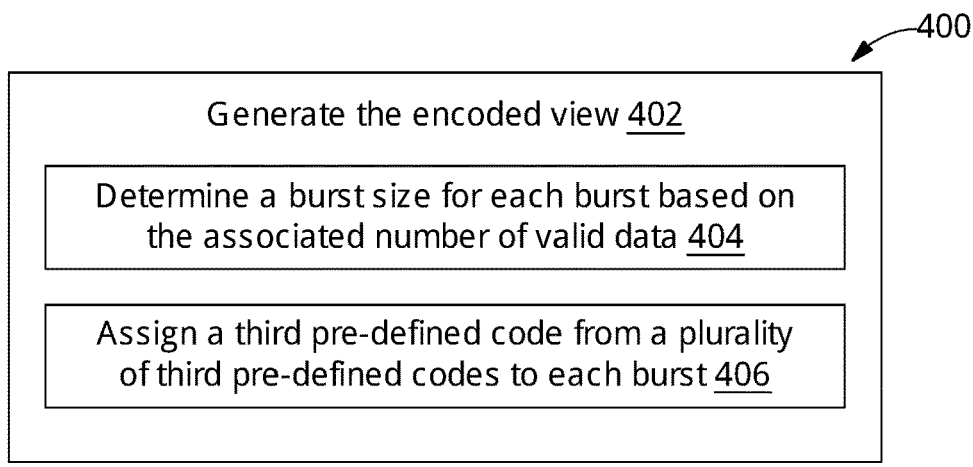
FIG. 4 illustrates a flowchart of a method for generating an encoded view of valid and invalid data transmitted in a sequence of transactions based on burst size information, in accordance with an embodiment.

Referring now to FIG. 4, a flowchart 400 of a method for generating an encoded view of valid and invalid data transmitted in a sequence of transactions based on burst size information is illustrated, in accordance with an embodiment. In this embodiment, the burst size signal is also one of the input signals that is used to generate transactions burstiness signature, in addition to the clock signal, the data valid signal, and the data signal. In order to generate the encoded view as mentioned via step 402, initially, a burst size may be determined for each burst, at step 404. In an embodiment, the burst size may be determined based on the burst size signal. In another embodiment, the burst size may be determined based on the associated number of valid data. In other words, the number of valid data transmitted in each burst may represent the burst size of that burst. Once the burst size for each burst is determined, at step 406, a third pre-defined code from a plurality of third pre-defined codes may be assigned to each burst based on the associated burst size. In an embodiment, each of the plurality of third pre-defined codes may be mapped to a burst size. By way of an example, the plurality of third pre-defined code may be alphabets, such as 'a, b, c, d'; numerical numbers, such as, '1, 2, 3, 4'; or symbols, such as, B', B'',B''', B''''. For example, when the number of valid data transmitted in a burst is '4', then the burst size determined for the burst may be '4'. Based on the determined burst size, '4', the third pre-defined code (for example, $A_4$, B'''', or 4) may be assigned to the burst. Additionally, invalid data may be assigned a value of '0' in the encoded view as discussed in FIG. 3. This has been further explained in conjunction with FIG. 8 and FIG. 9.

Figure 5:
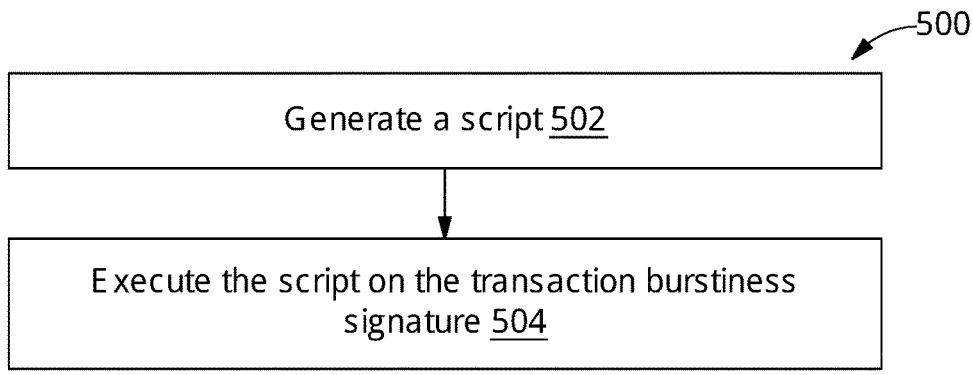
FIG. 5 illustrates a flowchart of a method for generating a script to identify at least one pattern of interest in transactions burstiness signature, in accordance with an embodiment.

Referring now to FIG. 5, a flowchart 500 for generating a script to identify at least one pattern of interest in transactions burstiness signature is illustrated, in accordance with an embodiment. Initially, at step 502, a script may be generated. It should be noted that, the script may correspond to a sequence of instructions that are carried out to automate execution of a task. In an embodiment, a user may generate the script to scan the transactions burstiness signature. The scanning of the transactions burstiness signature may be performed by executing the script on the transactions burstiness signature as mentioned via step 504. In an embodiment, the scanning of the transactions burstiness signature using the script may be performed to identify each of the at least one pattern of interest. The at least one pattern of interest may be pre-defined. Upon identifying the at least one pattern of interest, each of the at least one missing pattern of interest may be determined from the transactions burstiness signature. In other words, patterns of interest that are not found in the transactions burstiness signature are marked or determined as missing pattern of interest. This is explained further with reference to FIG. 10 and FIG. 11.

Figure 6:
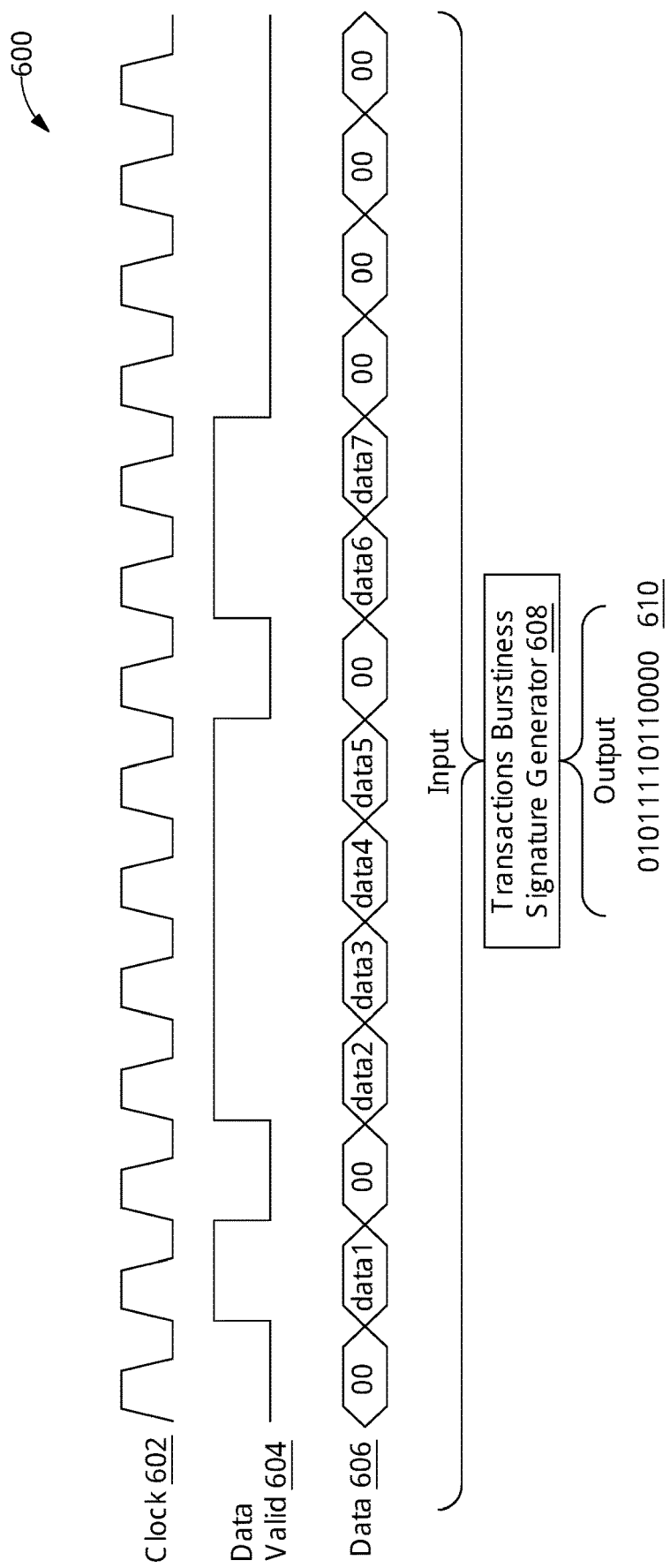
FIG. 6 is an exemplary representation of generation of an encoded view of valid and invalid data transmitted in a sequence of transactions without burst size information, in accordance with an exemplary embodiment.

Referring now to FIG. 6, a representation 600 of generation of an encoded view of valid and invalid data transmitted in a sequence of transactions without burst size information is represented, in accordance with an exemplary embodiment. In order to generate the transactions burstiness signature, the encoded view needs to be generated based on valid and invalid data transmitted in the sequence of transactions. In order to generate the encoded view, the set of signals from the plurality of signals associated with the sequence of transactions may be processed. In an embodiment, the plurality of signals may include at least one of a clock signal, a data valid signal and a data signal. As represented via the present FIG. 6, the set of signals includes a clock signal 602, a data valid signal 604, and a data signal 606.

With reference to FIG. 1, the set of signals represented in the present FIG. 6, may be generated by the DUT input generator 102. The set of signals associated with the sequence of transactions may be provided as the input to a transactions burstiness signature generator 608. In an embodiment, in order to generate the encoded view, the input data transmitted in the data signal 606 based on the data valid signal 604 may be iteratively checked. The check may be performed to identify whether the input data is the valid data or the invalid data. By way of an example, an input data '00' transmitted in the data signal 606 may represent the invalid data, while an input data 'data 1', 'data 2' and the like may represent the valid data. Based on the check performed the first predefined code, for example, '1' may be assigned to each valid data, i.e., 'data 1', 'data 2', and the like, transmitted in the data signal 606. In addition, based on the check performed, the second pre-defined code, for example, '0' may be assigned to each invalid data, i.e., '00' transmitted in the data signal 606. By way of another example, based on the check performed the first predefined code, for example, 'a' may be assigned to each valid data, i.e., 'data 1', 'data 2', and the like, transmitted in the data signal 606. In addition, based on the check performed, the second pre-defined code, for example, 'b' may be assigned each invalid data, i.e., '00' transmitted in the data signal 606. Further, based on one of the first pre-defined or the second pre-defined code assigned to each of the input data transmitted in the data signal 606 based on the data valid signal 604, the encoded view may be generated as depicted via an output 610. An exemplary representation of the transactions burstiness signature generated for the sequence of transactions based on processing of the set of signals depicted in present FIG. 6 is represented via FIG. 7.

Figure 7:
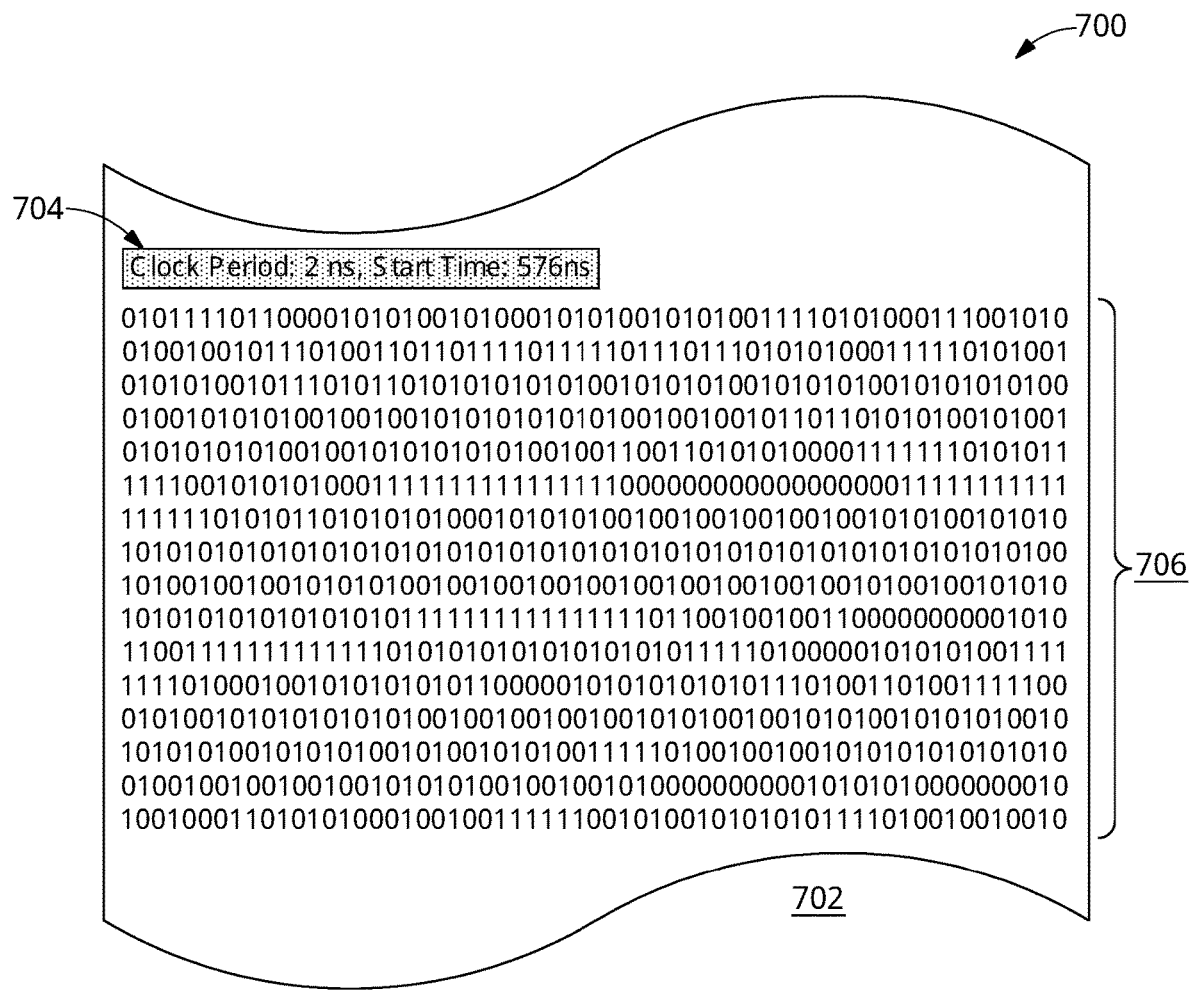
FIG. 7 represents a log file of a transactions burstiness signature for an encoded view generated without burst size information, in accordance with an exemplary embodiment.

Referring now to FIG. 7, a log file 700 of a transactions burstiness signature 702 for an encoded view generated without burst size information is represented, in accordance with an exemplary embodiment. The log file 700 represents the transactions burstiness signature 702. As represented by the log file 700, the transactions burstiness signature 702 may include the clock period associated with the clock signal 602 and start time of the sequence of transactions. The clock period and the start time included in the transactions burstiness signature 702 is represented via an arrow 704. In addition to the clock period and the start time, the transactions burstiness signature 702 may include the encoded view as represented via an arrow 706. In reference to FIG. 6, the encoded view represented via the transactions burstiness signature 702 may be generated based on processing of the set of signals associated with the sequence of transactions as represented via the FIG. 6.

Figure 8:
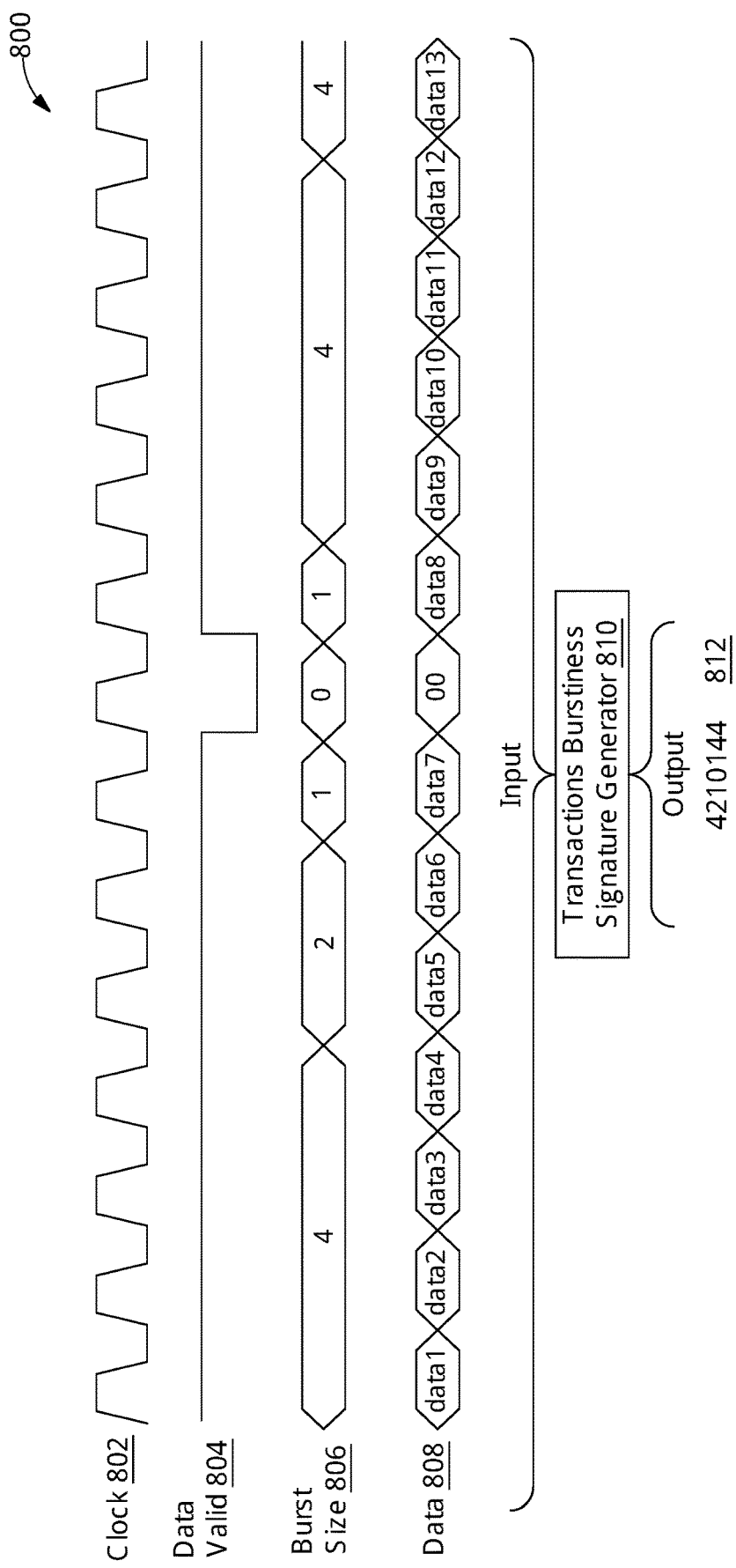
FIG. 8 is a representation of generation of an encoded view of valid and invalid data transmitted in a sequence of transactions based on a burst size of each burst, in accordance with an exemplary embodiment.

Referring now to FIG. 8, a representation 800 of generation of an encoded view of valid and invalid data transmitted in a sequence of transactions based on a burst size of each burst is represented, in accordance with an embodiment. In order to generate the transactions burstiness signature, the encoded view may be generated. In order to generate the encoded view, the set of signals from the plurality of signals associated with the sequence of transactions may be processed. In an embodiment, the plurality of signals may include at least one of a clock signal, a data valid signal, a data signal, and a burst size signal. As represented via the present FIG. 8, the set of signals includes a clock signal 802, a data valid signal 804, a burst size signal 806, and a data signal 808.

With reference to FIG. 1, the set of signals represented in the present FIG. 8 may be generated by the DUT input generator 102. In an embodiment, the DUT input generator 102 is also referred as the DUT input sequence. The plurality of signals associated with the sequence of transactions may be received by a transactions burstiness signature generator 810. In an embodiment, when the plurality of signals associated with the sequence of transactions includes the burst size signal 806, the transactions burstiness signature generator 810 may generate the encoded view based on the burst size derived from the burst size signal for each burst. The method of generating the encoded view based on the burst size is already explained in reference to FIG. 4.

In an embodiment, each of the associated burst size represents the number of valid data transmitted in each of the burst. As represented via the present FIG. 8, since four valid data packet is transmitted in first burst, therefore the burst size of the first burst may be determined to be '4'. Based on the determined burst size, the third pre-defined code, e.g., '4' may be assigned to the first burst. In a similar manner, the burst size of each burst may be determined based on the number of valid data packets in the burst and, based on the determined burst size, the third pre-defined code from the plurality of pre-defined codes may be assigned to each burst. The encoded view generated based on the set of signals associated with a portion of the sequence of transactions may correspond to an output 812 represented in the present FIG. 8. An exemplary representation of the transactions burstiness signature generated for the sequence of transactions based on processing of the set of signals is represented via FIG. 9.

Figure 9:
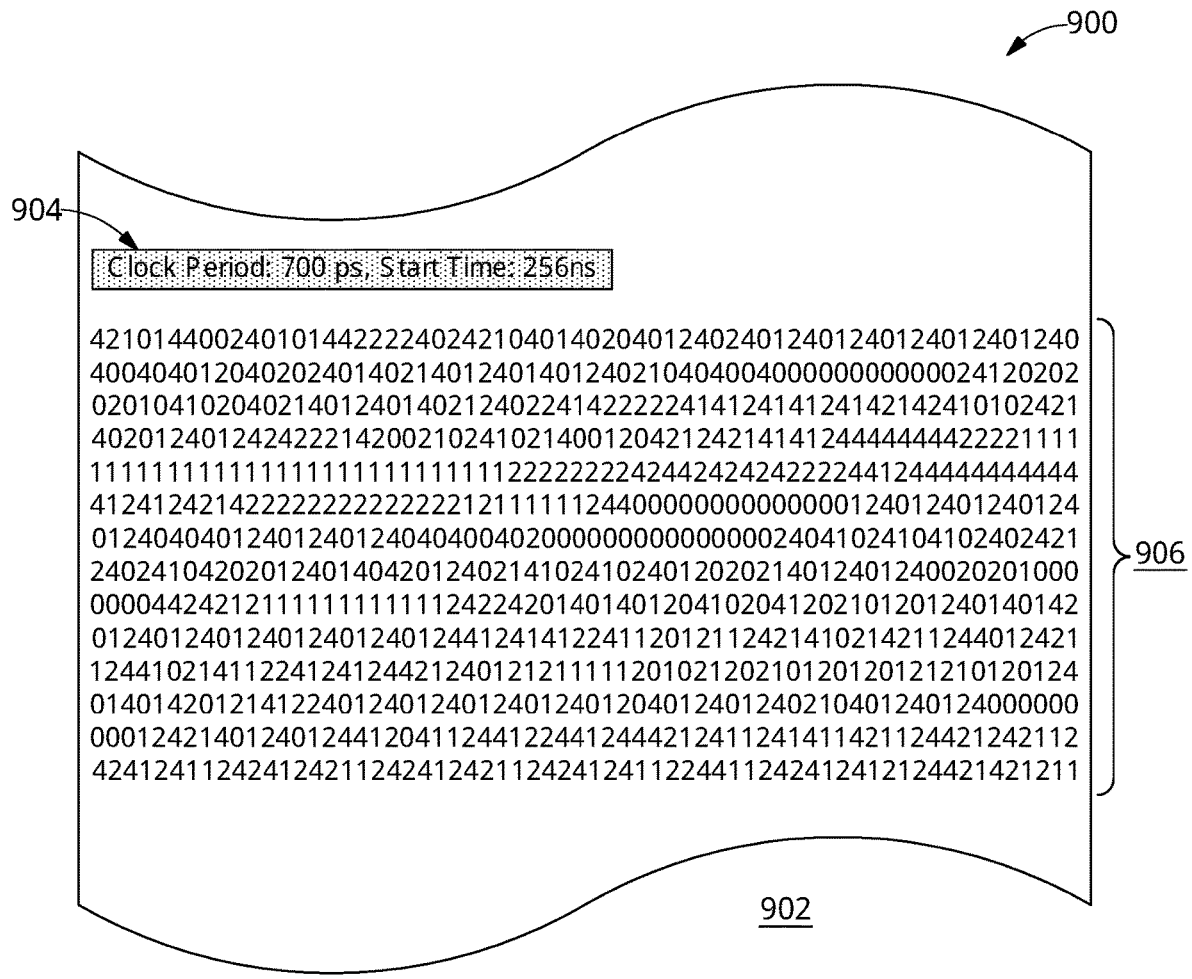
FIG. 9 represents a log file of a transactions burstiness signature for an encoded view generated based on burst size information, in accordance with an exemplary embodiment.

Referring now to FIG. 9, a log file 900 of a transactions burstiness signature 902 for an encoded view generated based on burst size information is represented, in accordance with an exemplary embodiment. The log file 900 represents the transactions burstiness signature 902. As represented by the log file 900, the transactions burstiness signature 902 may include the clock period associated with the clock signal 802 and start time of the sequence of transactions. The clock period and the start time included in the transactions burstiness signature 902 is represented via an arrow 904. In addition to the clock period and the start time, the transactions burstiness signature 902 may include the encoded view as represented via an arrow 906. With reference to FIG. 8, the encoded view represented via the transactions burstiness signature 902 may be generated based on processing of the set of signals associated with the sequence of transactions as represented via the FIG. 8.

Figure 10:
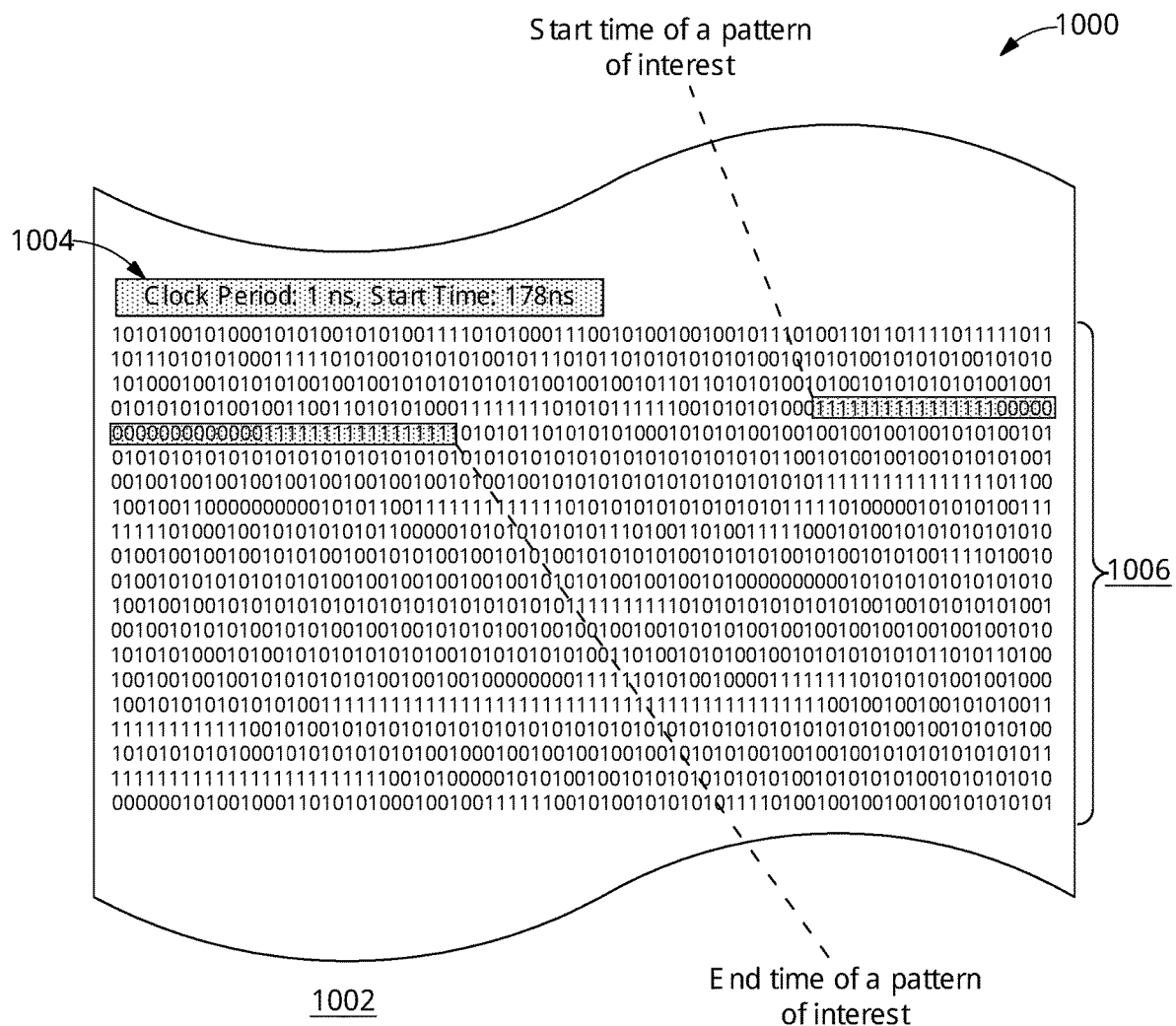
FIG. 10 represents a log file of a transactions burstiness signature including at least one pattern of interest, in accordance with an exemplary embodiment.

Referring now to FIG. 10, a log file 1000 of a transactions burstiness signature 1002 including at least one pattern of interest is represented, in accordance with an exemplary embodiment. As represented via the log file 1000, the transactions burstiness signature 1002 may include the clock period associated with the clock signal and start time of the sequence of transactions represented via an arrow 1004, and the encoded view of valid and invalid data transmitted in the sequence of transactions depicted via an arrow 1006. In addition, a pattern of interest identified in the transactions burstiness signature 1002 is shown via a grey highlighted portion. In order to identify the pattern of interest, the script may be executed on the transactions burstiness signature 1002. This has been already explained in reference to FIG. 5.

Further, using then clock period and the start time, a start time and an end time for the pattern of interest may be easily located by the user. In other words, the user may be able to locate the start time and the end time for any pattern of interest based on his requirement. In an embodiment, the detection of pattern of interest may be automated based on automatic detection by comparing pattern of interests pre-defined in a log file with the transactions burstiness signature 1002.

Figure 11:
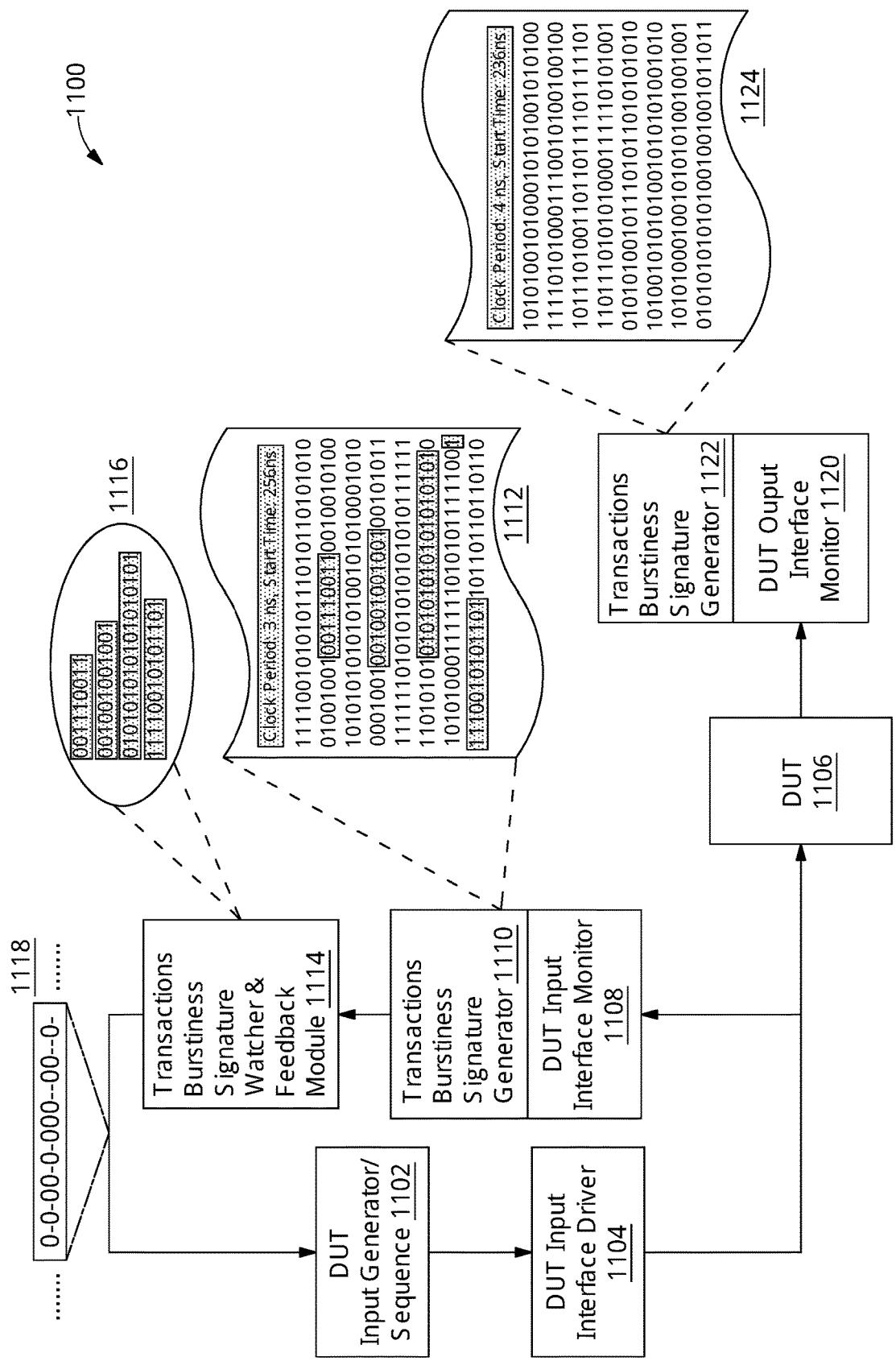
FIG. 11 illustrates a functional block diagram of a system configured for managing transactions burstiness associated with a sequence of transactions generated in a test environment for verifying a Device Under Test (DUT), in accordance with an embodiment.

Referring now to FIG. 11, a functional block diagram of a system 1100 configured for managing transactions burstiness associated with a sequence of transactions generated in a test environment for verifying a Device Under Test (DUT) is illustrated, in accordance with an embodiment. In order to generate the transactions burstiness signature, initially, a DUT input generator 1102 may generate a sequence of transactions. Further, the generated sequence of transactions may be provided as an input to a DUT 1106 via a DUT input interface driver 1104. Further, in addition to providing the sequence of transactions as the input to the DUT 1106, the sequence of transactions may be provided as the input to the transactions burstiness signature generator 1110 connected to a DUT input interface monitor 1108. Upon receiving the sequence of transactions, the transactions burstiness signature generator 1110 may process a set of signals from a plurality of signals associated with the sequence of transactions in order to generate the transactions burstiness signature representative of the sequence of transactions.

In an embodiment, the plurality of signals may include at least one of a clock signal, a data valid signal, a data signal, and a burst size signal. Based on processing of the set of signals from the plurality of signals, the transactions burstiness signature generator 1110 may generate the transactions burstiness signature representative of the sequence of transactions. In an exemplary embodiment, the transactions burstiness signature generated by the transactions burstiness signature generator 1110 is depicted via a log file 1112. In an embodiment, the transactions burstiness signature depicted via the log file 1112 may include an encoded view of valid and invalid data transmitted in the sequence of transactions and a clock period associated with the clock signal and start time of the sequence of transactions. This has been already explained in reference to FIG. 6 to FIG. 9. It should be noted that, the transactions burstiness signature generated by the transactions burstiness signature generator 1110 may represent the sequence of transactions provided as the input to the DUT 1106.

Upon generating the transactions burstiness signature, the generated transactions burstiness signature may be analyzed to identify at least one pattern of interest in the sequence of transactions. In an embodiment, at least one pattern of interest may be pre-defined and stored in the transactions burstiness signature watcher and feedback module 1114 using a file depicted as a file 1116. In an embodiment, the at least one pattern of interest may be identified by executing the script on the transactions burstiness signature based on the user input. Each of the at least one pattern of interest identified by executing the script on the transactions burstiness signature is represented in a grey highlight as shown via the log file 1112. Upon identifying each of the at least one pattern of interest, each of the at least one pattern of interest (represented via the file 1116) and the transactions burstiness signature represented via the log file 1112 may be provided as an input to a transactions burstiness signature watcher and feedback module 1114. The transactions burstiness signature watcher and feedback module 1114 may be configured to determine in case there is a pattern of interest missing by comparing the transactions burstiness signature in the log file 1112 with the pre-defined at least one pattern of interest in the file 1116. In an embodiment, each of the pre-defined at least one pattern of interest may correspond to an input provided by the user in the test environment corresponding to a test.

If at least one missing pattern of interest is determined based on the generated script. By way of an example, the script may be generated for comparison of an expected set of patterns of interest stored as a look-up table as represented via the file 1116, in the transactions burstiness signature watcher and feedback module 1114 against the transactions burstiness signature that may have each of the at least one pattern of interest. In an embodiment, each of the at least one missing pattern of interest may be absent in the transactions burstiness signature. In an embodiment, all the pattern of interest may be present in the transactions burstiness signature.

Upon identifying at least one missing pattern of interest, an input corresponding to the each of the at least one missing pattern of interest may be iteratively provided as an input 1118 (i.e., the feedback input) to the DUT input generator 1102. In an embodiment, the DUT input generator 1102 may also be referred as the DUT input sequence. Upon receiving each of the at least one missing pattern of interest, the DUT input generator 1102 may iteratively generate the subsequent sequence of transactions. Further, the subsequent sequence of transactions may be provided as an input to the DUT 1106 via the DUT input interface driver 1104 and the transactions burstiness signature generator 1110 connected to the DUT input interface monitor 1108. In one embodiment, the transactions burstiness signature generator 1110 may then generate the subsequent transactions burstiness signature associated with the subsequent sequence of transactions. In an embodiment, the subsequent sequence of transactions and the subsequent transactions burstiness signature may be iteratively generated till the subsequent transactions burstiness signature may include each of the pre-defined pattern of interest.

Further, upon receiving the subsequent sequence of transactions as input, the DUT 1106 may process the subsequent sequence of transactions to generate an output. The output generated by the DUT 1106 may be received by a DUT output interface monitor 1120. The DUT output interface monitor 1120 may be configured to observe and evaluate the generated output. The DUT output interface monitor 1120 may be connected with a transactions burstiness signature generator 1122. The transactions burstiness signature generator 1122 may be configured to process the output received from the DUT 1106 via the DUT output interface monitor 1120 in order to generate a transactions bustiness signature associated with the output as represented via a log file 1124. Based on processing of the output, the transactions burstiness signature generator 1122 may generate a transactions burstiness signature for the output generated by the DUT 1106. The transactions burstiness signature generated for the output is represented via a log file 1124.

In an embodiment, the transactions burstiness signature for the output may also be analyzed to determine if a pre-defined one or more pattern of interests for an output are present. Based on such an analysis, a result representing a success or failure of the test may be provided. In an embodiment, in case the transactions burstiness signature for the output includes all the pre-defined one or more pattern of interest for the output, then the output is rendered to be a success. In case, the transactions burstiness signature for the output includes some of the pre-defined one or more pattern of interest for the output then the output is rendered to be a partial success. In case, the transactions burstiness signature for the output includes none of the pre-defined one or more pattern of interest for the output then the output is rendered to be a failure. In an embodiment, the test may be iteratively performed in case the output is a partial success or a failure.

Various embodiments provide method and system for managing transactions burstiness associated with a sequence of transactions generated in a test environment for verifying a Device Under Test (DUT). The disclosed method and system may process a plurality of signals associated with a sequence of transactions. The plurality of signals may comprise at least one of a clock signal, a data valid signal, a data signal, and a burst size signal. Further, the disclosed method and system may generate a transactions burstiness signature representative of the sequence of transactions based on processing a set of signals from the plurality of signals. The transactions burstiness signature may include an encoded view of valid and invalid data transmitted in the sequence of transactions and a clock period associated with the clock signal and start time of the sequence of transactions. In addition, the disclosed method and the system may analyze the transactions burstiness signature to identify at least one pattern of interest in the sequence of transactions. Moreover, the disclosed method and the system may iteratively provide an input comprising at least one missing pattern of interest. The at least one missing pattern of interest may be absent in the transactions burstiness signature. Further, the disclosed method and the system may iteratively generate a subsequent sequence of transactions and a subsequent transactions burstiness signature associated with the subsequent sequence of transactions. The subsequent sequence of transactions and the subsequent transactions burstiness signature may be iteratively generated till the subsequent transactions burstiness signature includes each of the at least one missing pattern of interest.

The disclosed method and system may provide some advantages like, the disclosed method and the system may be methodology independent and hence may be used across any of existing industry standard verification methodologies. The disclosed method and system may generate a transactions burstiness signature for the input driven (i.e., the sequence of transactions) to the DUT that is used to identify if the input has a specific burst transactions pattern. Further, the disclosed method and system may enable identification of each of the at least one missing patterns of interest from the transactions burstiness signature. In addition, the disclosed method and the system may provide an ability to identify start time of a pattern of interest present anywhere within a sequence of transactions using the transactions burstiness signatures generated for input sequence of transactions and output sequence of transactions of the DUT. Moreover, the disclosed method and the system may enable a user to generate the pattern of interest based on his requirements.

It will be appreciated that, for clarity purposes, the above description has described embodiments of the invention with reference to different functional units and processors. However, it will be apparent that any suitable distribution of functionality between different functional units, processors or domains may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Although the present invention has been described in connection with some embodiments, it is not intended to be limited to the specific form set forth herein. Rather, the scope of the present invention is limited only by the claims. Additionally, although a feature may appear to be described in connection with particular embodiments, one skilled in the art would recognize that various features of the described embodiments may be combined in accordance with the invention.

Furthermore, although individually listed, a plurality of means, elements or process steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather the feature may be equally applicable to other claim categories, as appropriate.

What is claimed is:

1. A method of managing transactions burstiness associated with a sequence of transactions generated in a test environment for verifying a Device Under Test (DUT), the method comprising:
   processing a plurality of signals associated with a sequence of transactions, wherein the plurality of signals comprises at least one of a clock signal, a data valid signal, a data signal, and a burst size signal;
   generating a transactions burstiness signature representative of the sequence of transactions based on processing a set of signals from the plurality of signals, wherein the transactions burstiness signature comprises:
      an encoded view of valid and invalid data transmitted in the sequence of transactions; and
      a clock period associated with the clock signal and start time of the sequence of transactions;
   analysing the transactions burstiness signature to identify at least one pattern of interest;
   iteratively providing an input comprising at least one missing pattern of interest, wherein the at least one missing pattern of interest is absent in the transactions burstiness signature; and
   iteratively generating:
      a subsequent sequence of transactions; and
      a subsequent transactions burstiness signature associated with the subsequent sequence of transactions,
      wherein the subsequent sequence of transactions and the subsequent transactions burstiness signature are iteratively generated till the subsequent transactions burstiness signature comprises each of the at least one missing pattern of interest.

2. The method of claim 1, wherein the encoded view of each valid data comprises information of the associated burst size derived from the burst size signal.

3. The method of claim 2, wherein the associated burst size represents a number of valid data transmitted in each of a burst.

4. The method of claim 3, wherein generating the encoded view comprises:
   determining a burst size for each burst based on the associated number of valid data and the burst size signal; and
   assigning a third pre-defined code from a plurality of third pre-defined codes to each burst based on the associated burst size, wherein each of the plurality of third pre-defined codes is mapped to a burst size.

5. The method of claim 1, wherein generating the encoded view comprises:
   iteratively performing:
      receiving an input data transmitted in the data signal based on the data valid signal during a cycle in the clock signal;
      determining whether the input data is one of a valid data or an invalid data, in response to receiving the input data; and
      assigning one of a first predefined code or a second predefined code to the input data based on the check performed, wherein the first predefined code is assigned to each valid data and the second predefined code is assigned to each invalid data.

6. The method of claim 1, wherein generating the subsequent sequence of transactions and the subsequent transactions burstiness signature comprising:
   ensuring each of the at least one missing pattern is a part of the subsequent transactions burstiness signature.

7. The method of claim 1, further comprising:
   generating a script, wherein the generated script is configured to scan the transactions burstiness signature to:
      identify each of the at least one pattern of interest from the transactions burstiness signature based on a user input; and
      determine the at least one missing pattern of interest in response to identifying.

8. The method of claim 7, wherein analysing comprising executing the script on the transactions burstiness signature based on the user input for identifying each of the at least one pattern of interest.

9. A system for managing transactions burstiness associated with a sequence of transactions generated in a test environment for verifying a Device Under Test (DUT), the system comprising:
   a processor; and
   a memory coupled to the processor, wherein the memory stores processor- executable instructions, which, on execution, causes the processor to:
      process a plurality of signals associated with a sequence of transactions, wherein the plurality of signals comprises at least one of a clock signal, a data valid signal, a data signal, and a burst size signal;

generate a transactions burstiness signature representative of the sequence of transactions based on processing a set of signals from the plurality of signals, wherein the transactions burstiness signature comprises:
an encoded view of valid and invalid data transmitted in the sequence of transactions; and
a clock period associated with the clock signal and start time of the sequence of transactions;
analyse the transactions burstiness signature to identify at least one pattern of interest;
iteratively provide an input comprising at least one missing pattern of interest, wherein the at least one missing pattern of interest is absent in the transactions burstiness signature; and
iteratively generate:
a subsequent sequence of transactions; and
a subsequent transactions burstiness signature associated with the subsequent sequence of transactions,
wherein the subsequent sequence of transactions and the subsequent transactions burstiness signature are iteratively generated till the subsequent transactions burstiness signature comprises each of the at least one missing pattern of interest.

10. The system of claim 9, wherein the encoded view of each valid data comprises information of the associated burst size derived from the burst size signal.

11. The system of claim 10, wherein the associated burst size represents a number of valid data transmitted in each of a burst.

12. The system of claim 11, wherein, to generate the encoded view, the processor-executable instructions further cause the processor to:
determine a burst size for each burst based on the associated number of valid data and the burst size signal; and
assign a third pre-defined code from a plurality of third pre-defined codes to each burst based on the associated burst size, wherein each of the plurality of third pre-defined codes is mapped to a burst size.

13. The system of claim 9, wherein, to generate the encoded view, the processor-executable instructions further cause the processor to:
iteratively perform:
receive an input data transmitted in the data signal based on the data valid signal during a cycle in the clock signal;
determine whether the input data is one of a valid data or an invalid data, in response to receiving the input data; and
assign one of a first predefined code or a second predefined code to the input data based on the check performed, wherein the first predefined code is assigned to each valid data and the second predefined code is assigned to each invalid data.

14. The system of claim 9, wherein, to generate the subsequent sequence of transactions and the subsequent transactions burstiness signature, the processor-executable instructions further cause the processor to:
ensure each of the at least one missing pattern is a part of the subsequent transactions burstiness signature.

15. The system of claim 9, wherein the processor-executable instructions further cause the processor to:
generate a script, wherein the generated script is configured to scan the transactions burstiness signature to:
identify each of the at least one pattern of interest from the transactions burstiness signature based on a user input; and
determine the at least one missing pattern of interest in response to identifying.

16. The system of claim 15, wherein, to analyse, the processor-executable instructions further cause the processor to:
execute the script on the transactions burstiness signature based on the user input for identifying each of the at least one pattern of interest.

17. A non-transitory computer-readable medium storing computer-executable instructions for managing transactions burstiness associated with a sequence of transactions generated in a test environment for verifying a Device Under Test (DUT), the stored instructions, when executed by a processor, cause the processor to perform operations comprises:
processing a plurality of signals associated with a sequence of transactions, wherein the plurality of signals comprises at least one of a clock signal, a data valid signal, a data signal, and a burst size signal;
generating a transactions burstiness signature representative of the sequence of transactions based on processing a set of signals from the plurality of signals, wherein the transactions burstiness signature comprises:
an encoded view of valid and invalid data transmitted in the sequence of transactions; and
a clock period associated with the clock signal and start time of the sequence of transactions;
analysing the transactions burstiness signature to identify at least one pattern of interest;
iteratively providing an input comprising at least one missing pattern of interest, wherein the at least one missing pattern of interest is absent in the transactions burstiness signature;
iteratively generating:
a subsequent sequence of transactions; and
a subsequent transactions burstiness signature associated with the subsequent sequence of transactions,
wherein the subsequent sequence of transactions and the subsequent transactions burstiness signature are iteratively generated till the subsequent transactions burstiness signature comprises each of the at least one missing pattern of interest.

* * * * *